(12) United States Patent
Minzoni

(10) Patent No.: US 7,148,729 B2
(45) Date of Patent: Dec. 12, 2006

(54) DELAY LOCKED LOOP USING SYNCHRONOUS MIRROR DELAY

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 11/021,370

(22) Filed: Dec. 23, 2004

(65) Prior Publication Data

US 2006/0139075 A1   Jun. 29, 2006

(51) Int. Cl.
*H03L 7/06* (2006.01)

(52) U.S. Cl. .................................. 327/149; 327/158

(58) Field of Classification Search ............... 327/149, 327/153, 158, 161, 162, 163, 263, 269, 271; 331/17, 25, 1 A; 375/375, 376
See application file for complete search history.

(56) References Cited

U.S. PATENT DOCUMENTS

| 6,236,251 B1 | 5/2001 | Akamatsu | 327/144 |
| 2003/0034815 A1 | 2/2003 | Lin | 327/158 |

*Primary Examiner*—Linh My Nguyen
(74) *Attorney, Agent, or Firm*—Dicke, Billig & Czaja, PLLC

(57) ABSTRACT

A delay locked loop comprises a circuit configured to receive a clock signal, divide the clock signal by two to provide a divided clock signal, and mirror with respect to the divided clock signal a fractional portion of a feedback delay remaining after dividing the feedback delay by a multiple of a cycle of the clock signal to provide a first signal.

38 Claims, 9 Drawing Sheets

| CLK2 | CLK2,1 | CLK2,2 | FEEDBACK SELECTED |
|---|---|---|---|
| LOW | LOW | LOW | FB0 |
| LOW | LOW | HIGH | FB0/FB |
| LOW | HIGH | HIGH | FB |
| HIGH | HIGH | HIGH | FB |
| HIGH | HIGH | LOW | FB1 |
| HIGH | LOW | LOW | FB1 | ns
DELAY LOCKED LOOP USING SYNCHRONOUS MIRROR DELAY

BACKGROUND

Delay locked loops (DLLs) are used to align data output from circuits, such as memory circuits, to the clock signal of a host. A DLL receives a clock signal from a host and delays the clock signal to provide an output signal to an off-chip driver (OCD) to align data output by the OCD to the clock signal. The DLL compensates for differences in timing between the circuit and the host. Typically, a DLL includes a delay line, a feedback delay, and a phase detector. The delay line delays the clock signal to provide the output signal. The output signal is provided to the feedback delay. The feedback delay delays the output signal to provide a feedback signal to the phase detector. The feedback delay compensates for the differences in timing between the circuit and the host. The phase detector compares the feedback signal to the clock signal and outputs a control signal to adjust the delay of the delay line to reduce the phase difference between the clock signal and the feedback signal to zero.

One type of DLL uses a synchronous mirror delay (SMD). A SMD typically includes an enable input, a signal input, and a signal output. With the enable signal at a logic high, a rising edge of the input signal is mirrored with respect to the falling edge of the enable signal. The rising edge of the output signal is delayed with respect to the falling edge of the enable signal by a time equal to the delay between the rising edge of the input signal and the falling edge of the enable signal. A SMD can also mirror a falling edge of the input signal with respect to a rising edge of the enable signal.

A DLL based on a SMD has a number of limitations. One limitation is that the DLL is limited to a maximum frequency by the feedback delay. The feedback delay for the DLL cannot be greater than the cycle time of the clock signal; otherwise the delay between the rising edge of the input signal and the falling edge of the enable single is negative. To overcome this limitation, typically the clock signal is divided by two, four, eight, or other suitable number so that the feedback delay is less than the cycle time of the divided clock signal. This method, however, increases the number of SMD lines to two times the divisor of the clock signal. For example, if the clock signal is divided by four, eight SMD lines are needed to build the DLL. Increasing the number of SMDs increases the cost of the DLL. Another limitation of a DLL using a SMD is that if a rising edge to be mirrored falls too close to the rising or falling edge of the clock signal, the SMD may perform poorly in mirroring the signal.

SUMMARY

One embodiment of the present invention provides a delay locked loop. The delay locked loop comprises a circuit configured to receive a clock signal, divide the clock signal by two to provide a divided clock signal, and mirror with respect to the divided clock signal a fractional portion of a feedback delay remaining after dividing the feedback delay by a multiple of a cycle of the clock signal to provide a first signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
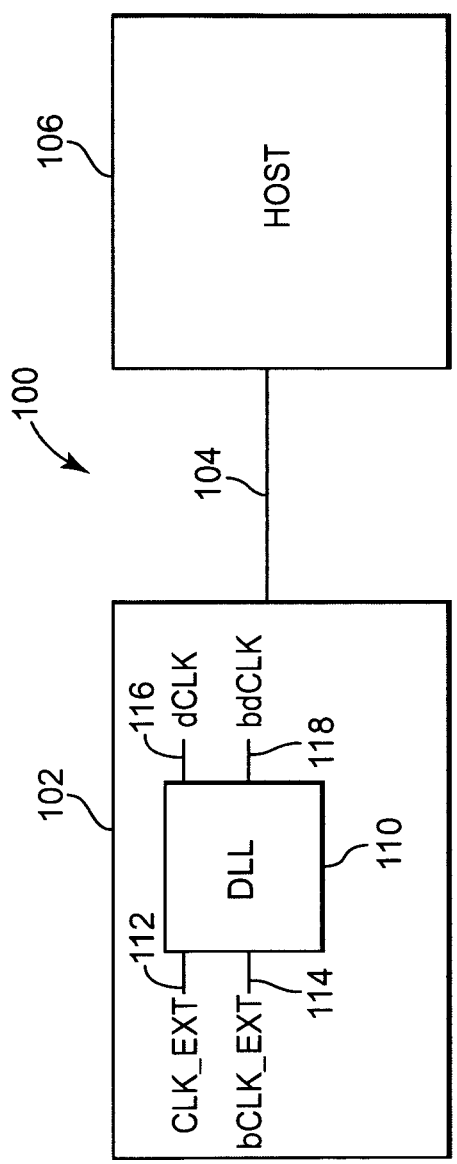
FIG. 1 is a block diagram illustrating one embodiment of a memory system.

FIG. 1 is a block diagram illustrating one embodiment of a memory system 100. Memory system 100 includes a memory circuit 102 and a host 106. In one embodiment, memory circuit 102 is a random access memory, such as a synchronous dynamic random access memory (SDRAM) or double data rate synchronous dynamic random access memory (DDR-SDRAM). Memory circuit 102 includes a delay locked loop (DLL) 110. In one embodiment, DLL 110 receives a clock signal, divides the clock signal by two to provide a divided clock signal, and mirrors with respect to the divided clock signal the fractional portion of a feedback delay remaining after dividing the feedback delay by a multiple of a cycle of the clock signal.

In one embodiment, DLL 110 uses synchronous mirror delays (SMDs) to mirror the fractional portion of the feedback delay. The fractional portion of the feedback delay is the portion of the feedback delay exceeding a multiple of a cycle of the clock signal. In one embodiment, DLL 110 generates a plurality of feedback signals and a plurality of clock signals. The DLL selects one of the plurality of feedback signals to mirror based on a feedback signal's position relative to the rising edges of the plurality of clock signals. The feedback signal having a rising edge farthest away from the rising edge and falling edge of the clock signal is selected to avoid mirroring limitations of the SMD.

Memory circuit 102 is electrically coupled host 106 through communication link 104. DLL 110 receives an external clock (CLK_EXT) signal on CLK_EXT signal path 112 and an inverted external clock (bCLK_EXT) signal on bCLK_EXT signal path 114. DLL 110 provides a delayed clock (dCLK) signal on dCLK signal path 116 and an inverted delayed clock (bdCLK) signal on bdCLK signal path 118.

Host 106 communicates with memory circuit 102 through communication link 104. In one embodiment, host 106 provides the CLK_EXT signal and the bCLK_EXT signal to memory circuit 102 through communication link 104. DLL 110 receives the CLK_EXT signal and the bCLK_EXT signal and delays the CLK_EXT and the bCLK_EXT signal through SMDs based on a feedback signal. The feedback signal is generated from the CLK_EXT signal and the bCLK_EXT signal by delaying the CLK_EXT signal and the bCLK_EXT signal to compensate for delays in memory circuit 102, such as receiver delays, off-chip driver delays, etc. DLL 110 provides the dCLK signal and the bdCLK signal to align data output from memory circuit 102 with the CLK_EXT signal and the bCLK_EXT signal.

Figure 2:
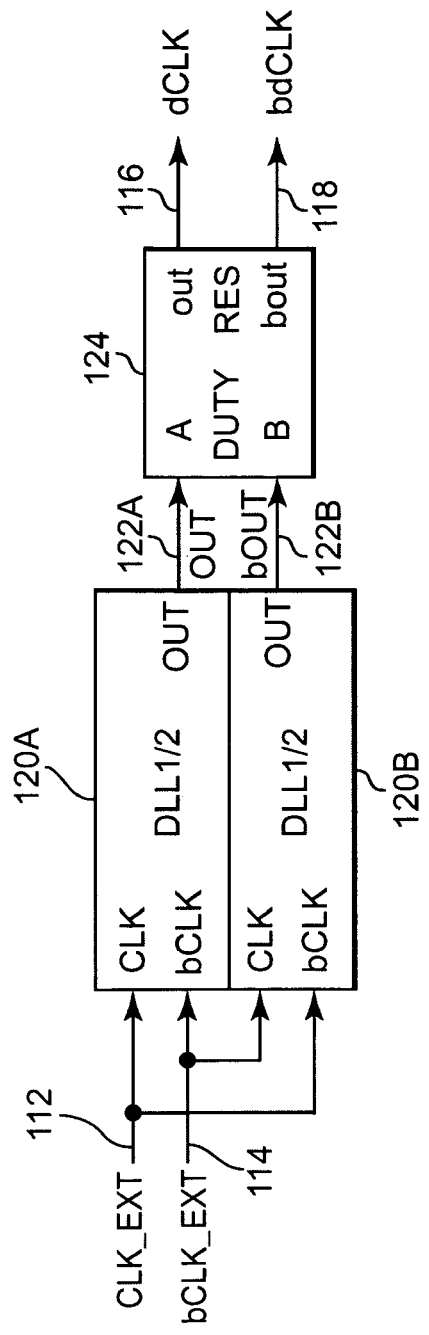
FIG. 2 is a block diagram illustrating one embodiment of a delay locked loop (DLL).

FIG. 2 is a block diagram illustrating one embodiment of DLL 110. DLL 110 includes DLL1/2 120A, DLL1/2 120B, and duty restoration circuit 124. CLK_EXT signal path 112 is electrically coupled to the clock (CLK) input of DLL1/2 120A and the inverted clock (bCLK) input of DLL1/2 120B. The bCLK_EXT signal path 114 is electrically coupled to the bCLK input of DLL1/2 120A and the CLK input of DLL1/2 120B. The output of DLL1/2 120A is electrically coupled to the first (A) input of duty restoration circuit 124 through output (OUT) signal path 122A. The output of DLL1/2 120B is electrically coupled to the second (B) input of duty restoration circuit 124 through inverted output (bOUT) signal path 122B. The output (OUT) of duty restoration circuit 124 is electrically coupled to dCLK signal path 116, and the inverted output (bOUT) of duty restoration circuit 124 is electrically coupled to bdCLK signal path 118.

DLL1/2 120A is similar to DLL1/2 120B, except that the CLK_EXT signal and the bCLK_EXT signal are swapped at the CLK and bCLK inputs of DLL1/2 120B. DLL1/2 120A delays the CLK_EXT signal by mirroring the rising edges of the CLK_EXT signal, and DLL1/2 120B delays the bCLK_EXT signal by mirroring the rising edges of the bCLK_EXT signal. Therefore, DLL1/2 120A outputs the OUT signal including the rising edge information for the CLK_EXT signal, and DLL1/2 120B outputs the bOUT signal including the falling edge information for the CLK_EXT signal.

Duty restoration circuit 124 receives the OUT signal including the rising edge information for the CLK_EXT signal at input A on OUT signal path 122A, and receives the bOUT signal including the falling edge information for the CLK_EXT signal at input B on bOUT signal path 122B. In response to the OUT signal and the bOUT signal, duty restoration circuit 124 uses the rising edge information provided by the OUT signal and falling edge information provided by the bOUT signal to provide the delayed clock (dCLK) signal on dCLK signal path 116 and the inverted delayed clock (bdCLK) signal on bdCLK signal path 118.

Figure 3:
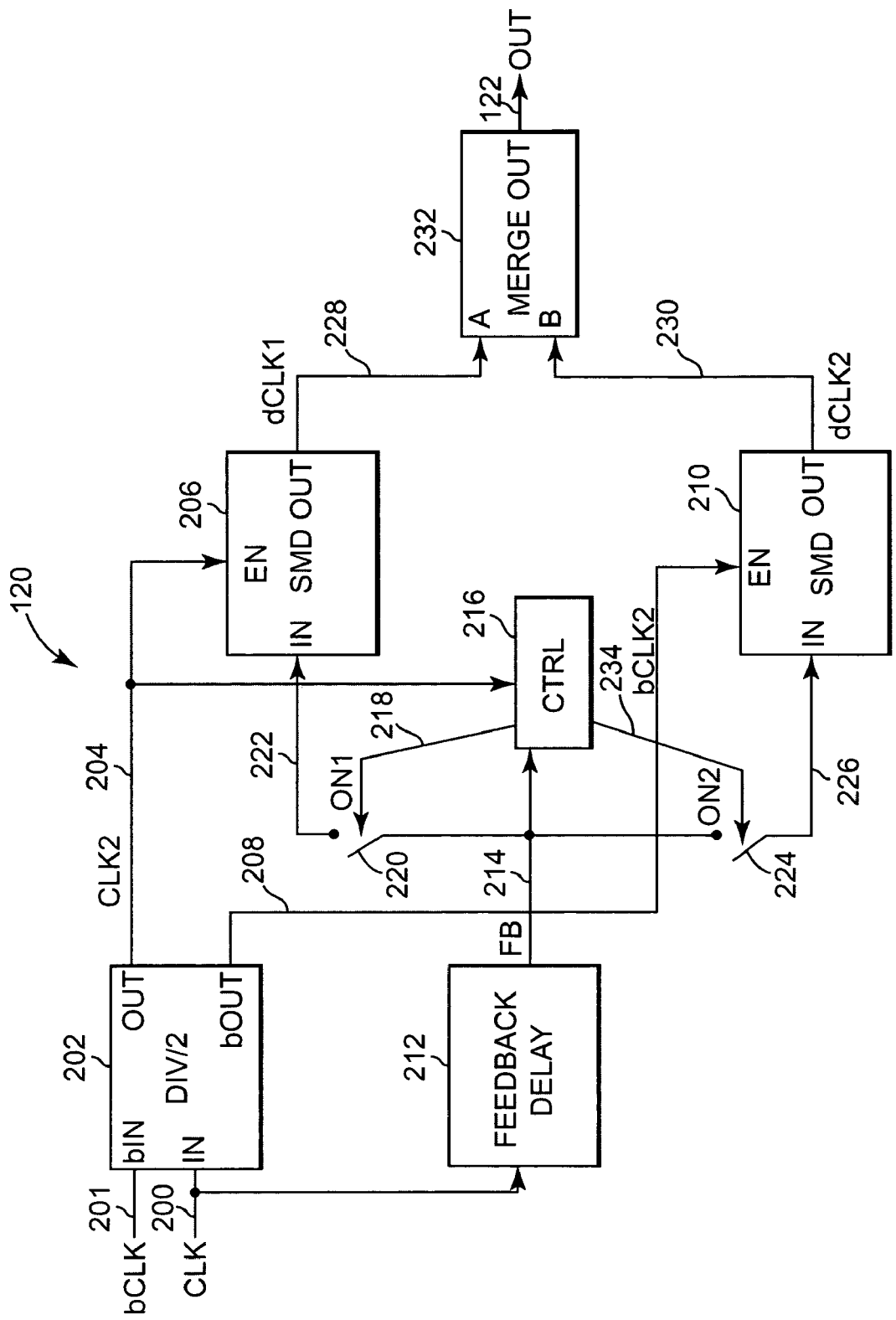
FIG. 3 is a schematic diagram illustrating one embodiment of a portion of the DLL.

FIG. 3 is a schematic diagram illustrating one embodiment of DLL1/2 120. DLL1/2 120 is similar to DLL1/2 120A and DLL1/2 120B. DLL1/2 120 includes clock divider (DIV/2) 202, feedback delay 212, SMDs 206 and 210, control circuit 216, and merge circuit 232. Clock divider circuit 202 receives a clock (CLK) signal on CLK signal path 200 and an inverted clock (bCLK) signal on bCLK signal path 201. For DLL1/2 120A, the CLK signal on CLK signal path 200 is the CLK_EXT signal on CLK_EXT signal path 112, and the bCLK signal on bCLK signal path 201 is the bCLK_EXT signal on bCLK_EXT signal path 114. For DLL1/2 120B, the CLK signal on CLK signal path 200 is the bCLK_EXT signal on bCLK_EXT signal path 114, and the bCLK signal on bCLK signal path 201 is the CLK_EXT signal on CLK_EXT signal path 112.

The output (OUT) of clock divider 202 is electrically coupled to the enable (EN) input of SMD 206 and to an input of control circuit 216 through CLK2 signal path 204. The inverted output (bOUT) of clock divider 202 is electrically coupled to input EN of SMD 210 through bCLK2 signal path 208. The CLK signal on CLK signal path 200 is provided to the input of feedback delay 212. The output of feedback delay 212 is electrically coupled to an input of control circuit 216, one side of switch 220, and one side of switch 224 through feedback (FB) signal path 214. The other side of switch 220 is electrically coupled to input IN of SMD 206 through signal path 222. The other side of switch 224 is electrically coupled to input IN of SMD 210 through signal path 226.

A first output of control circuit 216 is electrically coupled to the control input of switch 220 through ON1 signal path 218, and a second output of control circuit 216 is electrically coupled to the control input of switch 224 through ON2 signal path 234. The output of SMD 206 is electrically coupled to input A of merge circuit 232 through dCLK1 signal path 228. The output of SMD 210 is electrically coupled to input B of merge circuit 232 through dCLK2 signal path 230. The output of merge circuit 232 provides an output signal on output signal path 122. For DLL1/2 120A, the output signal on output signal path 122 is the OUT signal on OUT signal path 122A. For DLL1/2 120B, the output signal on output signal path 122 is the bOUT signal on bOUT signal path 122B.

Clock divider 202 receives the CLK signal on CLK signal path 200 and outputs a divided CLK signal on CLK2 signal path 204 and an inverted divided CLK signal on bCLK2 signal path 208. Clock divider 202 divides the CLK signal by two, such that the CLK2 signal and the bCLK2 signal both have a frequency equal to one half the frequency of the CLK signal. The CLK2 signal transitions to a logic high in response to a rising edge of the CLK signal and to a logic low in response to the next rising edge of the CLK signal. The bCLK2 signal transitions to a logic high in response to a rising edge of the CLK signal and to a logic low in response to the next rising edge of the CLK signal. Therefore, the CLK2 signal contains the rising edge information for the CLK signal, and the bCLK2 signal contains the rising edge information for the CLK signal. The duty cycle of the CLK2 signal and the bCLK2 signal is 50% due to clock divider 202.

Feedback delay 212 delays the CLK signal on CLK signal path 200 to provide the FB signal on FB signal path 214. Feedback delay 212 delays the CLK signal to compensate for delays in memory circuit 102, such as receiver delays, off-chip driver delays, buffer delays, etc. The length of the feedback delay can vary from less than a cycle of the CLK_EXT signal to greater than a cycle or multiple cycles of the CLK_EXT signal.

Control circuit 216 receives the CLK2 signal on CLK2 signal path 204 and the FB signal on FB signal path 214. Control circuit 216 determines where the rising edges of the FB signal will be received with respect to the CLK2 signal. If a rising edge of the FB signal will be received during a logic high phase of the CLK2 signal, control circuit 216 outputs an ON2 signal on ON2 signal path 234 to open switch 224 and an ON1 signal on ON1 signal path 218 to close switch 220. With switch 224 open and switch 220 closed, the FB signal is passed to input IN of SMD 206. If a rising edge of the FB signal will be received during a logic low phase of the CLK2 signal, control circuit 216 outputs an ON1 signal to open switch 220 and an ON2 signal to close switch 224. With switch 224 closed and switch 220 open, the FB signal is passed to input IN of SMD 210. Control circuit 216 alternately opens and closes switches 220 and 224 based upon where the rising edges of the FB signal will be received with respect to the CLK2 signal.

Therefore, feedback delay 212 is not limited by the cycle of the CLK_EXT signal since only the fractional portion of the feedback delay greater than a multiple of the cycle of the CLK_EXT signal is passed to SMD 206 and SMD 210. SMD 206 and SMD 210 mirror only the fractional portion of the feedback delay, not the entire feedback delay.

SMD 206 receives the CLK2 signal on CLK2 signal path 204 and the FB signal on signal path 222. SMD 206 mirrors the FB signal with respect to the CLK2 signal to provide the dCLK1 signal on dCLK1 signal path 228. The rising edge of the FB signal is mirrored with respect to the falling edge of the CLK2 signal, as described in more detail below with reference to FIG. 4.

SMD 210 receives the bCLK2 signal on bCLK2 signal path 208 and the FB signal on signal path 226. SMD 210 mirrors the FB signal with respect to the bCLK2 signal to provide the dCLK2 signal on dCLK2 signal path 230. The rising edge of the FB signal is mirrored with respect to the falling edge of the bCLK2 signal, as described in more detail below with reference to FIG. 4.

Merge circuit 232 receives the dCLK1 signal on dCLK1 signal path 228 and the dCLK2 signal on dCLK2 signal path 230. Merge circuit 232 merges the dCLK1 signal and the dCLK2 signal by performing an OR function to provide the output signal on output signal path 122. The output signal comprises the components of both the dCLK1 signal and the dCLK2 signal.

In operation, clock divider 202 divides the CLK signal by two to provide the CLK2 signal and bCLK2 signal. The frequency of the CLK2 signal and bCLK2 signal is one half the frequency of the CLK signal. Feedback delay 212 delays the CLK signal to provide the FB signal. The frequency of the FB signal equals the frequency of the CLK signal. Control circuit 216 determines where the rising edges of the FB signal will be received with respect to the CLK2 signal to alternatively turn on and off switches 220 and 224 to alternately pass the FB signal to input IN of SMD 206 and input IN of SMD 210, respectively. SMD 206 and SMD 210 mirror the rising edge of the FB signal with respect to the falling edge of the CLK2 signal and the falling edge of the bCLK2 signal to provide the dCLK1 signal and the dCLK2 signal, respectively. The dCLK1 signal represents the rising edge information for the CLK signal, and the dCLK2 signal represents the falling edge information for the CLK signal. Merge circuit 232 merges the dCLK1 signal and the dCLK2 signal to provide the output signal representing the rising edge information and the falling edge information for the CLK signal.

For DDL1/2 120A, the output signal of merge circuit 232 is the OUT signal on OUT signal path 122A comprising the rising edge information for the CLK_EXT signal. For DDL1/2 120B, the output signal of merge circuit 232 is the bOUT signal on bOUT signal path 122B comprising the falling edge information for the CLK_EXT signal.

Figure 4:
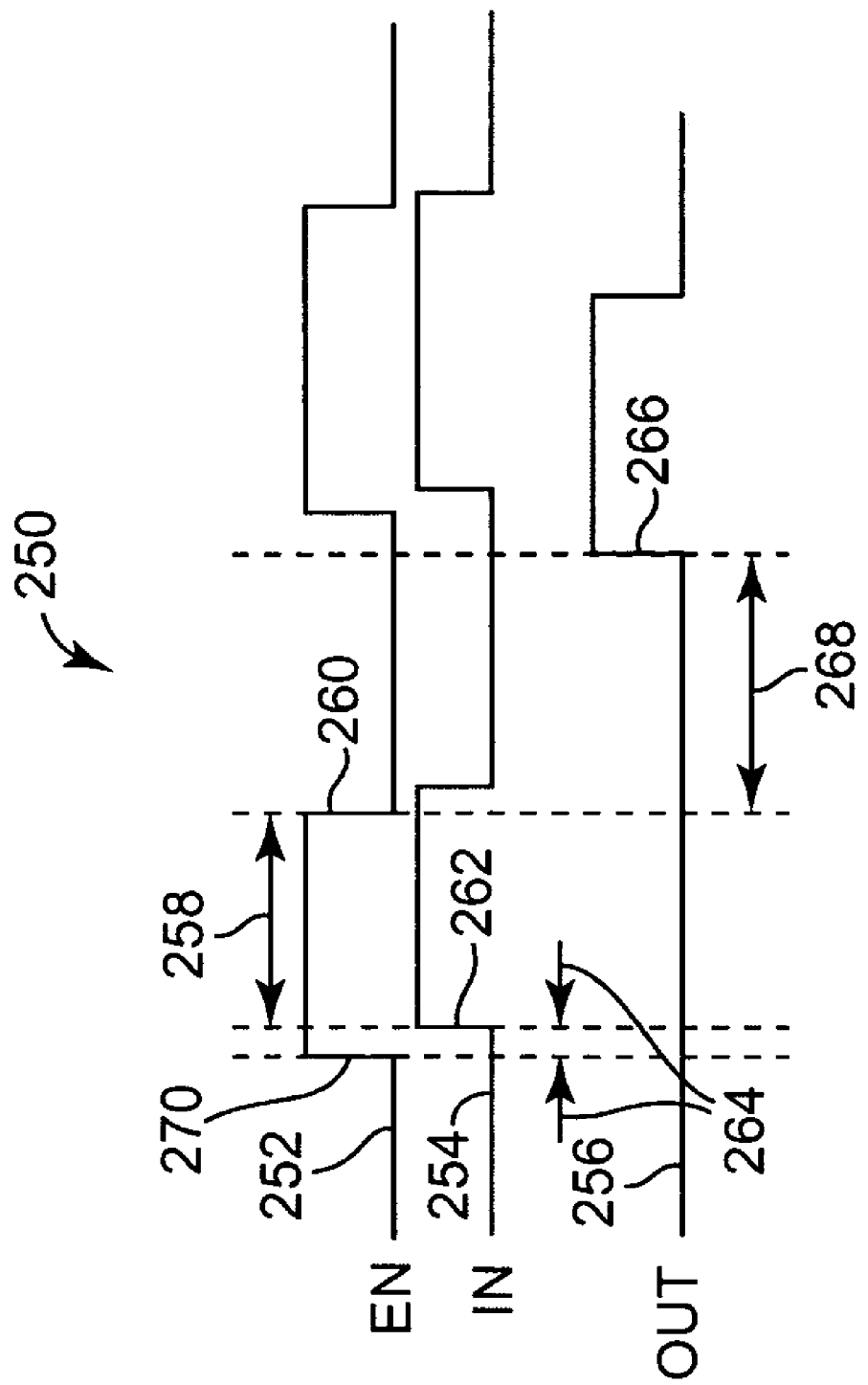
FIG. 4 is a timing diagram illustrating one embodiment of the timing of signals for a synchronous mirror delay (SMD).

FIG. 4 is a timing diagram 250 illustrating one embodiment of the timing of signals for SMD 206 and SMD 210. Timing diagram 250 includes input EN signal 252 on CLK2 signal path 204 or bCLK2 signal path 208, input IN signal 254 on signal path 222 or signal path 226, and OUT signal 256 on dCLK1 signal path 228 or dCLK2 signal path 230. With rising edge 262 of input IN signal 254 delayed with respect to rising edge 270 of input EN signal 252 by the delay indicated at 264, rising edge 262 of input IN signal 254 is mirrored with respect to falling edge 260 of input EN signal 252. The delay between rising edge 262 of input IN signal 254 and falling edge 260 of input EN signal 252 is indicated at 258. Rising edge 266 of OUT signal 256 is delayed with respect to falling edge 260 of input EN signal 252, as indicated at 268. The delay indicated at 268 is equal to the delay indicated at 258.

Figure 5:
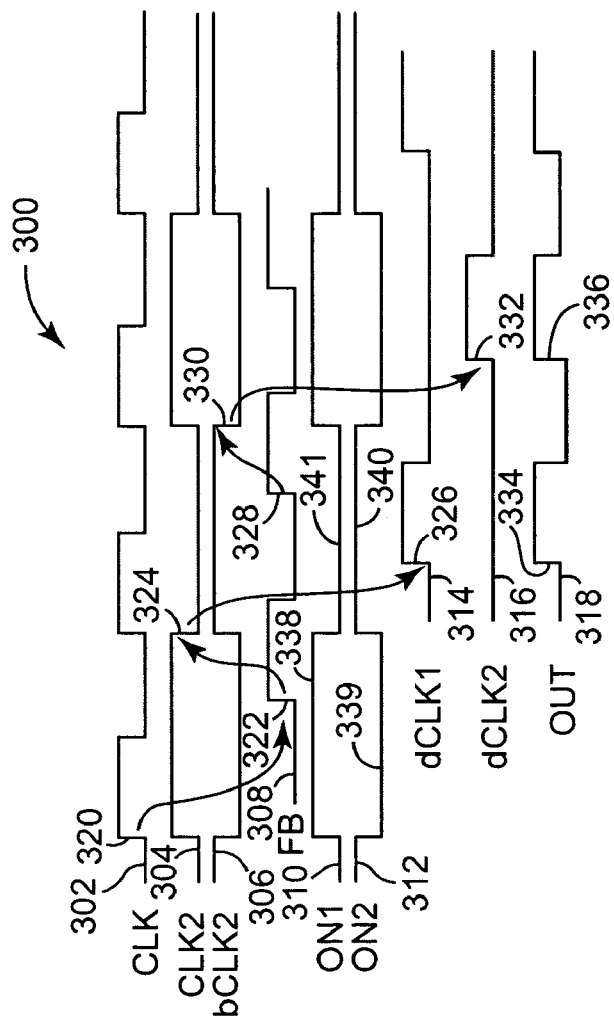
FIG. 5 is a timing diagram illustrating one embodiment of the timing of signals for the portion of the DLL illustrated in FIG. 3.

FIG. 5 is a timing diagram 300 illustrating one embodiment of the timing of signals for DLL1/2 120. Timing diagram 300 includes CLK signal 302 on CLK signal path 200, CLK2 signal 304 on CLK2 signal path 204, bCLK2 signal 306 on bCLK2 signal path 208, FB signal 308 on FB signal path 214, ON1 signal 310 on ON1 signal path 218, ON2 signal 312 on ON2 signal path 234, dCLK1 signal 314 on dCLK1 signal path 228, dCLK2 signal 316 on dCLK2 signal path 230, and OUT signal 318 on OUT signal path 122.

Clock divider 202 divides CLK signal 302 to provide CLK2 signal 304 and bCLK2 signal 306 having a frequency one half the frequency of CLK signal 302. In response to rising edge 320 of CLK signal 302, feedback delay 212 provides rising edge 322 of feedback signal 308. In response to determining that rising edge 322 of FB signal 308 will be received during a logic high phase of CLK2 signal 304, control circuit 216 provides a logic high 338 on ON1 signal 310 to close switch 220 and a logic low 339 on ON2 signal 312 to open switch 224. With switch 220 closed, SMD 206 receives FB signal 308 and mirrors rising edge 322 of FB signal 308 with respect to falling edge 324 of CLK2 signal 304 to provide rising edge 326 of dCLK1 signal 314.

In response to determining that rising edge 328 of FB signal 308 will be received during a logic low phase of CLK2 signal 304, control circuit 216 provides a logic high 340 on ON2 signal 312 to close switch 324 and a logic low 341 on ON1 signal 310 to open switch 220. With switch 224 closed, SMD 210 receives FB signal 308 and mirrors rising edge 328 of FB signal 308 with respect to the falling edge 330 of bCLK2 signal 306 to provide rising edge 332 of dCLK2 signal 316.

Merge circuit 232 receives dCLK1 signal 314 and dCLK2 signal 316 and provides OUT signal 318 having rising edge 334 in response to rising edge 326 of dCLK1 signal 314 and rising edge 336 in response to rising edge 332 of dCLK2 signal 316. For DDL1/2 120A, OUT signal 318 provides the rising edge information for the CLK_EXT signal. For DLL1/2 120B, OUT signal 318 provides the falling edge information for the CLK_EXT signal.

Figure 6:
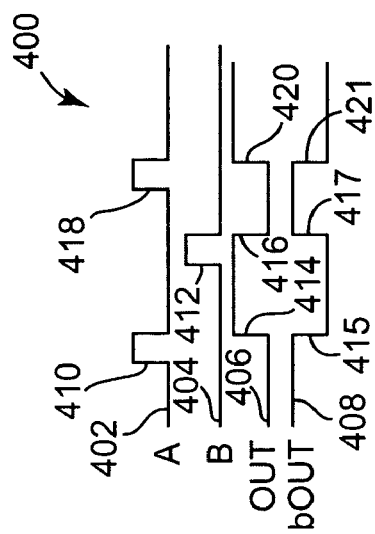
FIG. 6 is a timing diagram illustrating one embodiment of the timing of signals for a duty restoration circuit.

FIG. 6 is a timing diagram 400 illustrating one embodiment of the timing of signals for duty restoration circuit 124. Timing diagram 400 includes input A signal 402 on OUT signal path 122A, input B signal 404 on bOUT signal path 122B, OUT signal 406 on dCLK signal path 116 and bOUT signal 408 on bdCLK signal path 118.

In response to rising edge 410 of input A signal 402, OUT signal 406 transitions to a logic high at 414 and bOUT signal 408 transitions to a logic low at 415. In response to the rising edge 412 of input B signal 404, OUT signal 406 transitions to a logic low at 416 and bOUT signal 408 transitions to a logic high at 417. The process repeats at rising edge 418 of input A signal 402, which transitions OUT signal 406 to a logic high at 420 and bOUT signal 408 to a logic low at 421. OUT signal 406 has a logic high time and bOUT signal 408 has a logic low time equivalent to the time between rising edge 410 of input A signal 402 and rising edge 412 of input B signal 404. OUT signal 406 has a logic low time and bOUT signal 408 has a logic high time equivalent to the time between rising edge 412 of input B signal 404 and rising edge 418 of input A signal 402.

Duty restoration circuit 124 combines the rising edge information for the CLK_EXT signal from the OUT signal on OUT signal path 122A and the falling edge information for the CLK_EXT signal from the bOUT signal on bOUT signal path 122B. Duty restoration circuit 124 provide the dCLK signal on dCLK signal path 116 and the bdCLK signal on bdCLK signal path 118 comprising both the rising edge information and the falling edge information of the CLK_EXT signal. The dCLK signal and the bdCLK signal provide a delayed CLK_EXT signal and a delayed bCLK_EXT signal, respectively. The dCLK signal and the bdCLK signal are used, in one embodiment, to align data output from memory circuit 102 with the CLK_EXT signal and the bCLK_EXT signal.

Figure 7:
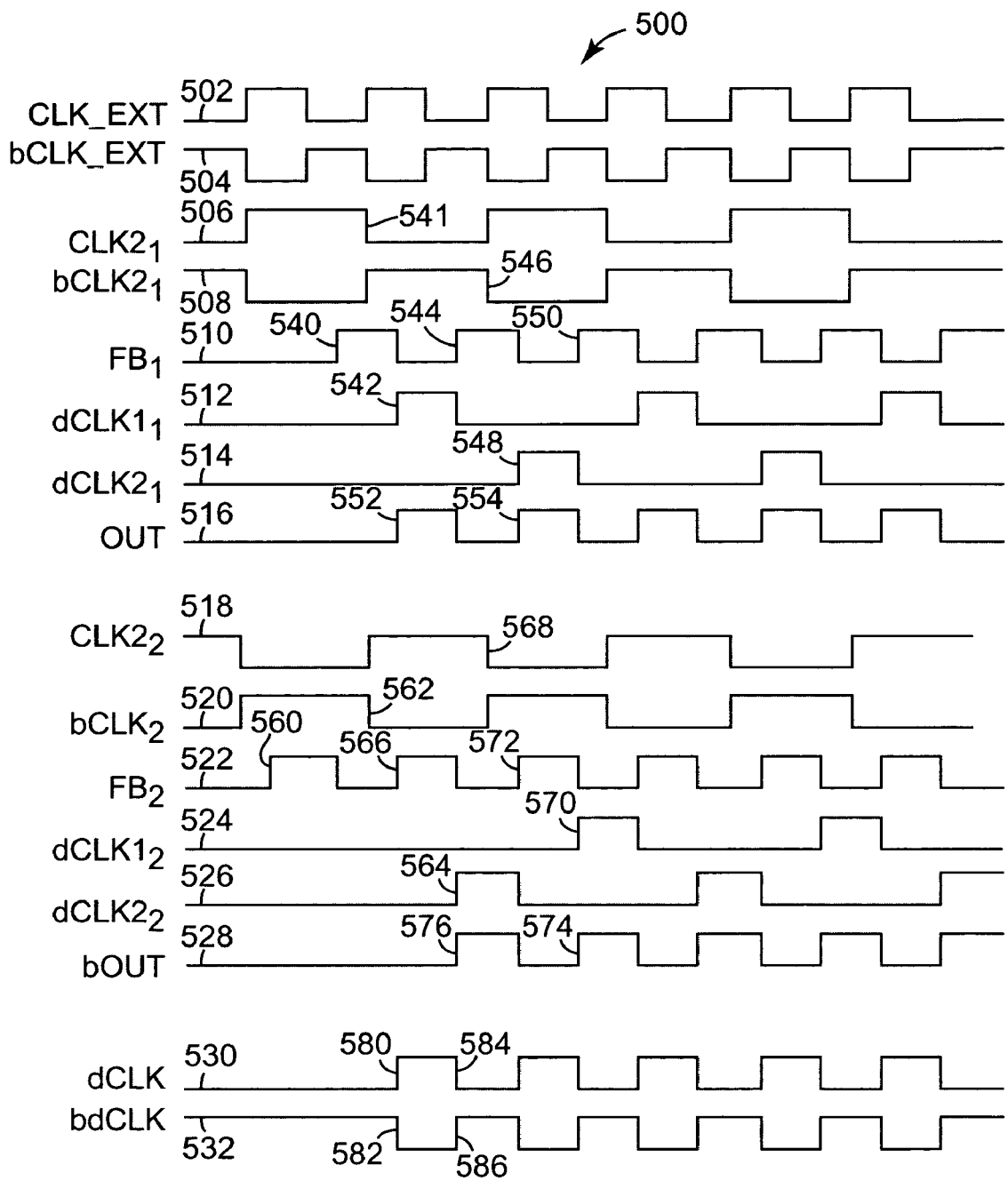
FIG. 7 is a timing diagram illustrating one embodiment of the timing of signals for the DLL.

FIG. 7 is a timing diagram 500 illustrating one embodiment of the timing of signals for DLL 110. Timing diagram 500 includes CLK_EXT signal 502 on CLK_EXT signal path 112 and bCLK_EXT signal 504 on bCLK_EXT signal path 114. Timing diagram 500 also includes CLK2$_1$ signal 506 on CLK signal path 200 of DLL1/2 120A, bCLK2$_1$ signal 508 on bCLK signal path 201 of DLL1/2 120A, FB$_1$ signal 510 on FB signal path 214 of DLL1/2 120A, dCLK1$_1$ signal 512 on dCLK1 signal path 228 of DLL1/2 120A, dCLK2$_1$ signal 514 on dCLK2 signal path 230 of DLL1/2 120A, and OUT signal 516 on OUT signal path 122A. Timing diagram 500 also includes CLK2$_2$ signal 518 on CLK2 signal path 204 of DLL1/2 120B, bCLK2$_2$ signal 520 on bCLK2 signal path 208 of CLK1/2 120B, FB$_2$ signal 522 on FB signal path 214 of DLL1/2 120B, dCLK1$_2$ signal 524 on dCLK1 signal path 228 of DLL1/2 120B, dCLK2$_2$ signal 526 on dCLK2 signal path 230 of DLL1/2 120B, and bOUT signal 528 on bOUT signal path 122B. Timing diagram 500 also includes dCLK signal 530 on dCLK signal path 116 and bdCLK signal 532 on bdCLK signal path 118.

For DLL1/2 120A, clock divider 202 divides CLK_EXT signal 502 to provide CLK2$_1$ signal 506 and bCLK2$_1$ signal 508 both having a frequency half the frequency of CLK_EXT signal 502. Feedback delay 212 provides FB$_1$ signal 510 having a rising edge at 540. Rising edge 540 of FB$_1$ signal 510 is mirrored by SMD 206 with respect to falling edge 541 of CLK2$_1$ signal 506 to provide rising edge 542 of dCLK1$_1$ signal 512. Rising edge 544 of FB$_1$ signal 510 is mirrored by SMD 210 with respect to falling edge 546 of bCLK2$_1$ signal 508 to provide rising edge 548 of dCLK2$_1$ signal 514. The mirroring process continues at rising edge 550 of FB$_1$ signal 510. Merge circuit 232 of DLL1/2 120A receives rising edge 542 of dCLK1$_1$ signal 512 and provides rising edge 552 of OUT signal 516. Merge circuit 232 also receives rising edge 548 of dCLK2$_1$ signal 514 and provides rising edge 554 of OUT signal 516. OUT signal 516 comprises the rising edge information for the delayed CLK_EXT signal.

For DLL1/2 120B, clock divider 202 divides bCLK_EXT signal 504 to provide CLK2$_2$ signal 518 and bCLK2$_2$ signal 520 having a frequency half the frequency of bCLK_EXT signal 504. Feedback delay 212 provides FB$_2$ signal 522 having a rising edge at 560. Rising edge 560 of FB$_2$ signal 522 is mirrored by SMD 210 with respect to falling edge 562 of bCLK2$_2$ signal 520 to provide rising edge 564 of dCLK2$_2$ signal 526. Rising edge 566 of FB$_2$ signal 522 is mirrored by SMD 206 with respect to falling edge 568 of CLK2$_2$ signal 518 to provide rising edge 570 of dCLK1$_2$ signal 524. The mirroring process is continues at rising edge 572 of FB$_2$ signal 522. Merge circuit 232 of DLL1/2 120B receives rising edge 564 of dCLK2$_2$ signal 526 and provides rising edge 576 of bOUT signal 528. Merge circuit 232 also receives rising edge 570 of dCLK1$_2$ signal 524 and provides rising edge 574 of bOUT signal 528. The bOUT signal comprises the falling edge information for the delayed CLK_EXT signal.

Duty restoration circuit 124 receives OUT signal 516 and bOUT signal 528 and in response to rising edge 552 of OUT signal 516, provides rising edge 580 of dCLK signal 530 and falling edge 582 of bdCLK signal 532. In response to rising edge 576 of bOUT signal 528, duty restoration circuit 124 provides falling edge 584 of dCLK signal 530 and rising edge 586 of bdCLK signal 532. The process is repeated such that dCLK signal 530 and bdCLK signal 532 provide delayed clock signals locked to CLK_EXT signal 502 and bCLK_EXT signal 504.

The preceding description and figures illustrate one embodiment of DLL 110 where the DLL will function correctly as long as SMD 206 properly mirrors the FB signal with respect to the CLK2 signal and SMD 210 properly mirrors the FB signal with respect to the bCLK2 signal. As described in the Background section, a SMD may have a difficult time mirroring an input signal if the rising edge of the input signal is received too close to the rising edge or falling edge of the enable signal. The following FIGS. 8–11 provide another embodiment of DLL 110 that accounts for this limitation of a SMD.

Figure 8:
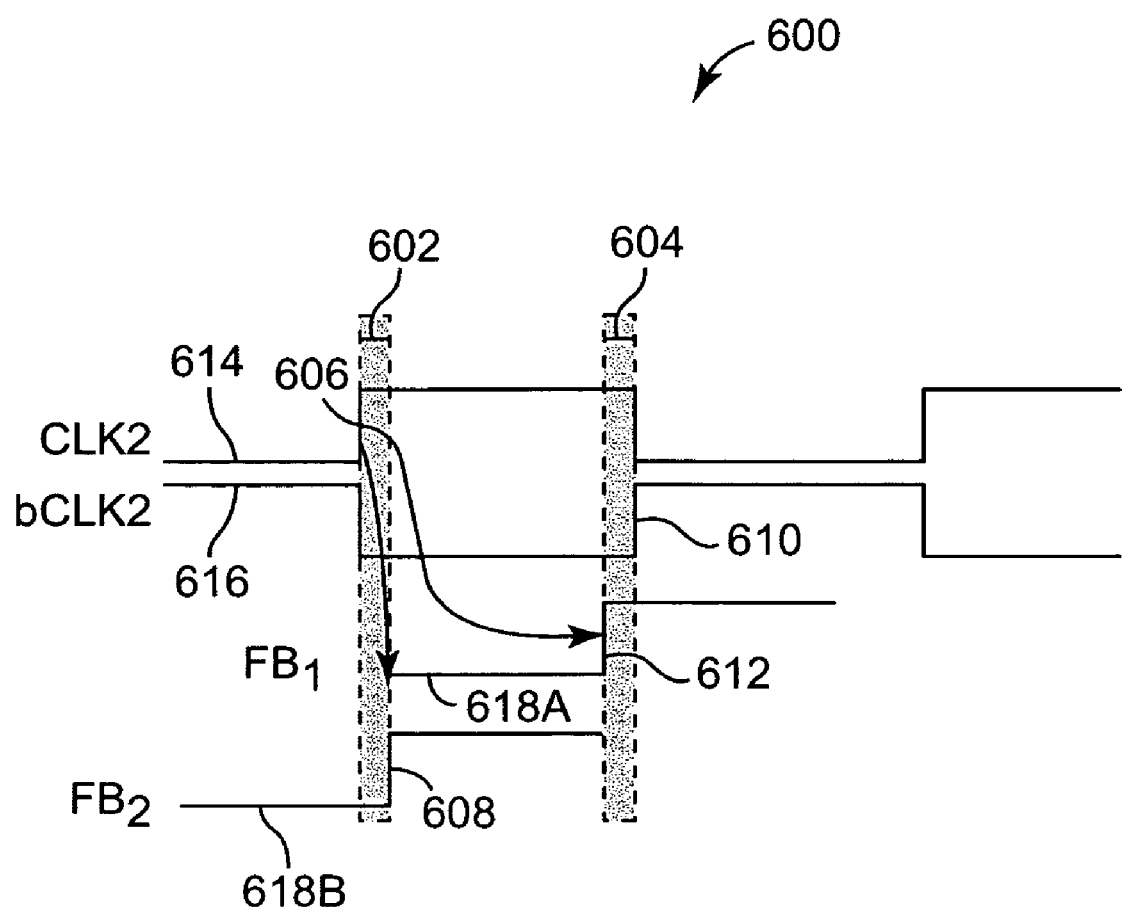
FIG. 8 is a timing diagram illustrating one embodiment of limitations of a SMD.

FIG. 8 is a timing diagram 600 illustrating one embodiment of the limitations of a SMD, such as SMD 206 or SMD 210. Timing diagram 600 includes CLK2 signal 614, bCLK2 signal 616, FB$_1$ signal 618A illustrating one embodiment for the FB signal, and FB$_2$ signal 618B illustrating another embodiment for the FB signal. If rising edge 612 of FB$_1$ signal 618A or rising edge 608 of the FB$_2$ signal 618B is too close to rising edge 606 of CLK2 signal 614 or rising edge 610 of bCLK2 signal 616, then the SMD has a difficult time mirroring FB$_1$ signal 618A or FB$_2$ signal 618B. The areas where the SMD may not mirror the FB signal correctly are indicated at 602 and 604.

Figure 9:
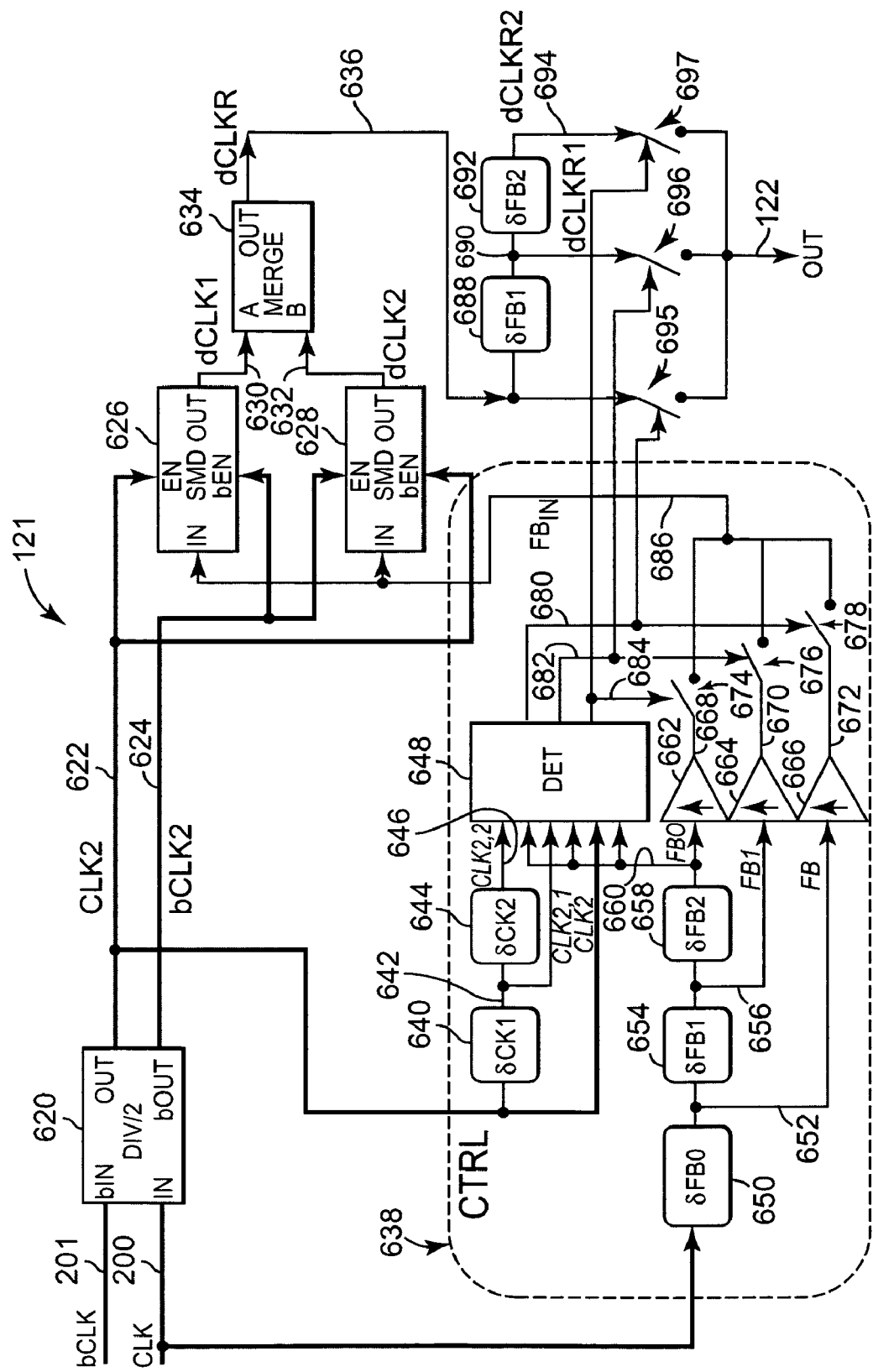
FIG. 9 is a schematic diagram illustrating another embodiment of a portion of the DLL to compensate for the limitations of the SMD.

FIG. 9 is a schematic diagram illustrating another embodiment, DLL1/2 121, of DLL1/2 120. In one embodiment, DLL1/2 121 is similar to DLL1/2 120A and DLL1/2 120B. DLL1/2 121 includes clock divider (DIV/2) 620, SMDs 626 and 628, merge circuit 634, controller 638, feedback delay one (δFB1) 688, feedback delay two (δFB2) 692, and switches 695, 696, and 697. In one embodiment, controller 638 includes CLK2 delay one (δCK1) 640, CLK2 delay two (δCK2) 644, detection circuit 648, feedback delay zero (δFB0) 650, feedback delay one (δFB1) 654, feedback delay two (δFB2) 658, pulse generators 662, 664, and 666, and switches 674, 676, and 678.

The bCLK signal path 201 is electrically coupled to input bIN of clock divider 620. CLK signal path 200 is electrically coupled to input IN of clock divider circuit 620 and the input of feedback delay zero 650. For DLL1/2 120A, the CLK signal on CLK signal path 200 is the CLK_EXT signal on CLK_EXT signal path 112 and the bCLK signal on bCLK signal path 201 is the bCLK_EXT signal on bCLK_EXT signal path 114. For DLL1/2 120B, the CLK signal on CLK signal path 200 is the bCLK_EXT signal on bCLK_EXT signal path 114 and the bCLK signal on bCLK signal path 201 is the CLK_EXT signal on CLK_EXT signal path 112.

The output (OUT) of clock divider circuit 620 is electrically coupled to the input of CLK2 delay one 640, an input of detection circuit 648, input EN of SMD 626, and the inverted enable input (bEN) of SMD 628 through CLK2 signal path 622. The inverted output (bOUT) of clock divider 620 is electrically coupled to input bEN of SMD 626 and input EN of SMD 628 through bCLK2 signal path 624. The output of CLK2 delay one 640 is electrically coupled to the input of CLK2 delay two 644 and an input of detection circuit 648 through CLK2,1 signal path 642. CLK2 delay two 644 is electrically coupled to detection circuit 648 through CLK2,2 signal path 646.

The output of feedback delay zero 650 is electrically coupled to the input of feedback delay one 654 and the input of pulse generator 666 through FB signal path 652. The output of feedback delay one 654 is electrically coupled to the input of feedback delay two 658 and the input of pulse generator 664 through FB1 signal path 656. The output of feedback delay two 658 is electrically coupled to the input of pulse generator 662 and an input of detection circuit 648 through FB0 signal path 660.

The output of pulse generator 662 is electrically coupled to one side of switch 674 through signal path 668. The output of pulse generator 664 is electrically coupled to one side of switch 676 through signal path 670. The output of pulse generator 666 is electrically coupled to one side of switch 678 through signal path 672. Detection circuit 648 is electrically coupled to the control input of switch 674 and the control input of switch 697 through signal path 684. Detection circuit 648 is electrically coupled to the control input of switch 676 and the control input of switch 696 through signal path 682. Detection circuit 648 is electrically coupled to the control input of switch 678 and the control input of switch 695 through signal path 680. The other side of switches 674, 676, and 678 are electrically coupled to input IN of SMD 626 and input IN of SMD 628 through $FB_{IN}$ signal path 686.

The output of SMD 626 is electrically coupled to input A of merge circuit 634 through dCLK1 signal path 630. The output of SMD 628 is electrically coupled to input B of merge circuit 634 through dCLK2 signal path 632. The output of merge circuit 634 is electrically coupled to the input of feedback delay one 688 and one side of switch 695 through dCLKR signal path 636. The output of feedback delay one 688 is electrically coupled to one side of switch 696 and the input of feedback delay two 692 through dCLKR1 signal path 690. The output of feedback delay two 692 is electrically coupled to one side of switch 697 through dCLKR2 signal path 694. The other side of switches 695, 696, and 697 are electrically coupled to OUT signal path 122. For DLL1/2 120A, the output signal on OUT signal path 122 is the OUT signal on OUT signal path 122A. For DLL1/2 120B, the output signal on OUT signal path 122 is the bOUT signal on bOUT signal path 122B.

Clock divider 620 receives the CLK signal on CLK signal path 200 and outputs a divided CLK signal on CLK2 signal path 622 and an inverted divided CLK signal on bCLK2 signal path 624. Clock divider 620 divides the CLK signal by two, such that the CLK2 signal and the bCLK2 signal both have a frequency equal to one half the frequency of the CLK signal. The CLK2 signal transitions to a logic high in response to a rising edge of the CLK signal and to a logic low in response to the next rising edge of the CLK signal. The bCLK2 signal transitions to a logic high in response to a rising edge of the CLK signal and to a logic low in response to the next rising edge of the CLK signal. Therefore, the CLK2 signal contains the rising edge information for the CLK signal, and the bCLK2 signal contains the rising edge information for the CLK signal. The duty cycle of the CLK2 signal and the bCLK2 signal is 50% due to clock divider 620.

CLK2 delay one 640 receives the CLK2 signal on CLK2 signal path 622 and delays the CLK2 signal to provide the CLK2,1 signal on CLK2,1 signal path 642. CLK2 delay two 644 receives the CLK2,1 signal on signal path 642 and delays the CLK2,1 signal to provide the CLK2,2 signal on CLK2,2 signal path 646. In one embodiment, the delay of CLK2 delay one 640 is approximately equal to the delay of CLK2 delay two 644. In other embodiments, the delay of CLK2 delay one 640 is different than the delay of CLK2 delay two 644. The CLK2,2 signal is delayed less than one half of the cycle of the CLK signal with respect to the CLK2 signal.

Feedback delay zero 650 delays the CLK signal on CLK signal path 200 to provide the FB signal on FB signal path 652. Feedback delay zero 650 is similar to feedback delay 212 (FIG. 3). In one embodiment, feedback delay zero 650 delays the CLK signal to compensate for delays in memory circuit 102, such as receiver delays, off-chip driver delays, buffer delays, etc. The length of the feedback delay can vary from less than a cycle of the CLK_EXT signal to greater than a cycle or multiple cycles of the CLK_EXT signal.

Feedback delay one 654 delays the FB signal on FB signal path 652 to provide the FB1 signal on FB1 signal path 656. Feedback delay two 658 delays the FB1 signal on FB1 signal path 656 to provide the FB0 signal on FB0 signal path 660. In one embodiment, the delay of feedback delay one 654 is approximately equal to the delay of feedback delay two 658. In other embodiments, the delay of feedback delay one 654 is different than the delay of feedback delay two 658. The FB0 signal is delayed less than one half of the cycle of the FB signal with respect to the FB signal. Pulse generators 662, 664, and 666 provide pulses in response to rising edges of the FB0 signal, the FB1 signal, and the FB signal, respectively.

Detection circuit 648 receives the CLK2 signal, CLK2,1 signal, CLK2,2 signal, and FB0 signal. Detection circuit 648 determines the phase of the FB0 signal at a rising edge of the CLK2 signal, at a rising edge of the CLK2,1 signal, and at a rising edge of CLK2,2 signal to determine which feedback signal, FB0, FB1, or FB, to pass to SMD 626 and SMD 628 to avoid the limitations of SMD 626 and SMD 628. The function of detection circuit 648 is described in more detail below with reference to FIGS. 10A–10B.

If detection circuit 648 determines to pass the FB signal to SMD 626 and SMD 628, detection circuit 648 outputs a signal on signal path 684 to close switches 674 and 697, a signal on signal path 682 to open switches 676 and 696, and a signal on signal path 680 to open switches 678 and 695. If detection circuit 648 determines to pass the FB1 signal to SMD 626 and SMD 628, detection circuit 648 outputs a signal on signal path 684 to open switches 674 and 697, a signal on signal path 682 to close switches 676 and 696, and a signal on signal path 680 to open switches 678 and 695. If detection circuit 648 determines to pass the FB0 signal to SMD 626 and SMD 628, detection circuit 648 outputs a signal on signal path 684 to close switches 674 and 697, a signal on signal path 682 to open switches 676 and 696, and a signal on signal path 680 to open switches 678 and 695. The selected feedback signal, FB, FB1, or FB0 is passed through the corresponding switch 678, 676, or 674, respectively, to provide the $FB_{IN}$ signal on $FB_{IN}$ signal path 686.

SMD 626 receives the CLK2 signal on CLK2 signal path 622, the bCLK2 signal on bCLK2 signal path 624, and the $FB_{IN}$ signal on $FB_{IN}$ signal path 686. SMD 626 mirrors the $FB_{IN}$ signal with respect to the CLK2 signal to provide the dCLK1 signal on dCLK1 signal path 630. The rising edge of the FB$_{IN}$ signal is mirrored with respect to the falling edge of the CLK2 signal.

SMD 628 receives the bCLK2 signal on bCLK2 signal path 624, the CLK2 signal on CLK2 signal path 622, and the FB$_{IN}$ signal on FB$_{IN}$ signal path 686. SMD 628 mirrors the FB$_{IN}$ signal with respect to the bCLK2 signal to provide the dCLK2 signal on dCLK2 signal path 632. The rising edge of the FB$_{IN}$ signal is mirrored with respect to the falling edge of the bCLK2 signal.

Merge circuit 634 receives the dCLK1 signal on dCLK1 signal path 630 and the dCLK2 signal on dCLK2 signal path 632. Merge circuit 634 merges the dCLK1 signal and the dCLK2 signal by performing an OR function to provide the dCLKR signal on dCLKR signal path 636. The dCLKR signal comprises the components of both the dCLK1 signal and the dCLK2 signal.

Feedback delay one 688 delays the dCLKR signal on dCLKR signal path 636 to provide the dCLKR1 signal on dCLKR1 signal path 690. The delay of feedback delay one 688 is equal to the delay of feedback delay one 654. Feedback delay two 692 delays the dCLKR1 signal on dCLKR1 signal path 690 to provide the dCLKR2 signal on dCLKR2 signal path 694. The delay of feedback delay two 692 is equal to the delay of feedback delay two 658. Based on the state of switches 695, 696, and 697, as set by detection circuit 648, the dCLKR signal on dCLKR signal path 636, the dCLKR1 signal on dCLKR1 signal path 690, or the dCLKR2 signal on dCLKR2 signal path 694 is passed to OUT signal path 122, respectively.

In operation, clock divider 620 divides the CLK signal by two to provide the CLK2 signal and bCLK2 signal. The frequency of the CLK2 signal and bCLK2 signal is one half the frequency of the CLK signal. CLK2 delay one 640 delays the CLK2 signal to provide the CLK2,1 signal. CLK2 delay two 644 delays the CLK2,1 signal to provide the CLK2,2 signal. Feedback delay zero 650 delays the CLK signal to provide the FB signal. The frequency of the FB signal equals the frequency of the CLK signal. Feedback delay one 654 delays the FB signal to provide the FB1 signal. Feedback delay two 658 delays the FB1 signal to provide the FB0 signal.

Detection circuit 648 determines the phase of the FB signal at the rising edge of the CLK2 signal, at the rising edge of the CLK2,1 signal, and at the rising edge of the CLK2,2 signal. The determination is used to select which feedback signal, FB0, FB1, or FB, to pass to SMD 626 and SMD 628, and which signal, dCLKR, dCLKR1, or dCLKR2, to pass to OUT signal path 122.

SMD 626 and SMD 628 mirror the rising edge of the FB$_{IN}$ signal with respect to the falling edge of the CLK2 signal and the bCLK2 signal to provide the dCLK1 signal and the dCLK2 signal, respectively. The dCLK1 signal represents the rising edge information for the CLK signal, and the dCLK2 signal represents the falling edge information for the CLK signal. Merge circuit 634 merges the dCLK1 and dCLK2 signals to provide the dCLKR signal. Feedback delay one 688 delays the dCLKR signal to provide the dCLKR1 signal to compensate for selecting the FB1 signal for the FB$_{IN}$ signal. Feedback delay two 692 delays the dCLKR1 signal to provide the dCLKR2 signal to compensate for selecting the FB0 signal for the FB$_{IN}$ signal. The signal output on OUT signal path 122 represents the rising edge information and the falling edge information for the CLK signal.

For DDL1/2 120A, the output signal on OUT signal path 122 is the OUT signal on OUT signal path 122A comprising the rising edge information for the CLK_EXT signal. For DDL1/2 120B, the output signal on OUT signal path 122 is the bOUT signal on bOUT signal path 122B comprising the falling edge information for the CLK_EXT signal.

Figure 10A:
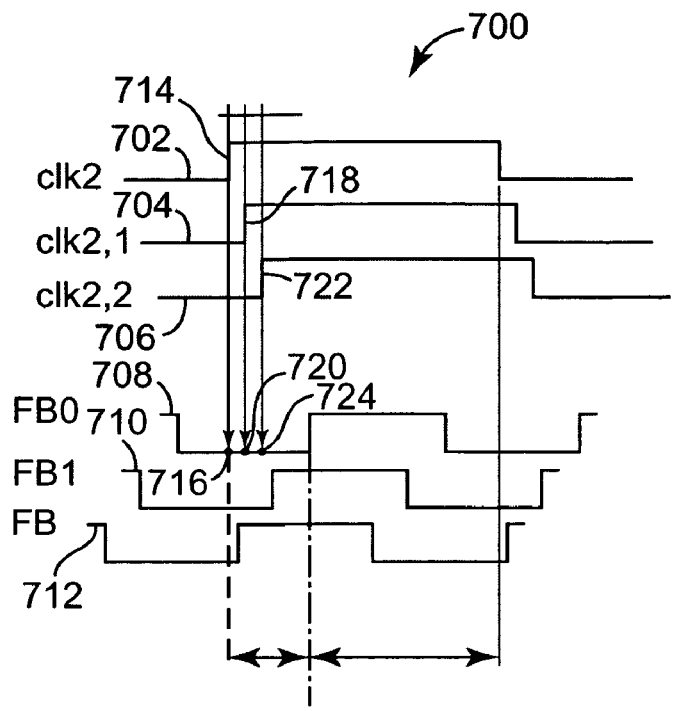
FIG. 10A is a timing diagram illustrating one embodiment of selecting a feedback signal to use for the portion of the DLL illustrated in FIG. 9.

FIG. 10A is a timing diagram 700 illustrating one embodiment of the selection of a feedback signal by detection circuit 648. Timing diagram 700 includes CLK2 signal 702 on CLK2 signal path 622, CLK2,1 signal 704 on CLK2,1 signal path 642, CLK2,2 signal 706 on CLK2,2 signal path 646, FB0 signal 708 of FB0 signal path 660, FB1 signal 710 on FB1 signal path 656, and FB signal 712 on FB signal path 652. Detection circuit 648 determines the phase of FB0 signal 708 at rising edge 714 of CLK2 signal 304. In this case, the phase of FB0 signal 708 is logic low, as indicated at 720. Detection circuit 648 determines the phase of FB0 signal 708 at rising edge 718 of CLK2,1 signal 704. In this case, the phase of FB0 signal 708 is also logic low, as indicated at 720. Detection circuit 648 determines the phase of FB0 signal 708 at rising edge 722 of CLK2,2 signal 706. In this case, the phase of FB0 signal 708 is also logic low, as indicated at 724. In this embodiment, FB0 signal 708 is selected for the FB$_{IN}$ signal because based on the determination, FB0 signal 708 is least likely to result in SMD 626 or SMD 628 operating in a problem area, such as problem area 602 or 604 illustrated in FIG. 8.

Figure 10B:
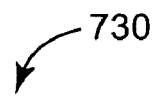
FIG. 10B is a table illustrating one embodiment of the selection criteria for selecting the feedback signal to use for the portion of the DLL illustrated in FIG. 9.

FIG. 10B is a table 730 illustrating one embodiment of how detection circuit 648 determines which feedback signal to select based on the selection process illustrated above in FIG. 10A. If the phase of the FB0 signal is logic low at the rising edge of the CLK2 signal, logic low at the rising edge of the CLK2,1 signal, and logic low at the rising edge of the CLK2,2 signal, as illustrated in the embodiment of FIG. 10A, then the FB0 signal is selected for the FB$_{IN}$ signal. If the phase of the FB0 signal is logic low at the rising edge of the CLK2 signal, logic low at the rising edge of the CLK2,1 signal, and logic high at the rising edge of the CLK2,2 signal, then the FB0 signal or the FB signal is selected for the FB$_{IN}$ signal. If the phase of the FB0 signal is logic low at the rising edge of the CLK2 signal, logic high at the rising edge of the CLK2,1 signal, and logic high at the rising edge of the CLK2,2 signal, then the FB signal is selected for the FB$_{IN}$ signal. If the phase of the FB0 signal is logic high at the rising edge of the CLK2 signal, logic high at the rising edge of the CLK2,1 signal, and logic high at the rising edge of the CLK2,2 signal, then the FB signal is selected for the FB$_{IN}$ signal. If the phase of the FB0 signal is logic high at the rising edge of the CLK2 signal, logic high at the rising edge of the CLK2,1 signal, and logic low at the rising edge of the CLK2,2 signal, then the FB1 signal is selected for the FB$_{IN}$ signal. If the phase of the FB0 signal is logic high at the rising edge of the CLK2 signal, logic low at the rising edge of the CLK2,1 signal, and logic low at the rising edge of the CLK2,2 signal, then the FB1 signal is selected for the FB$_{IN}$ signal.

Figure 11:
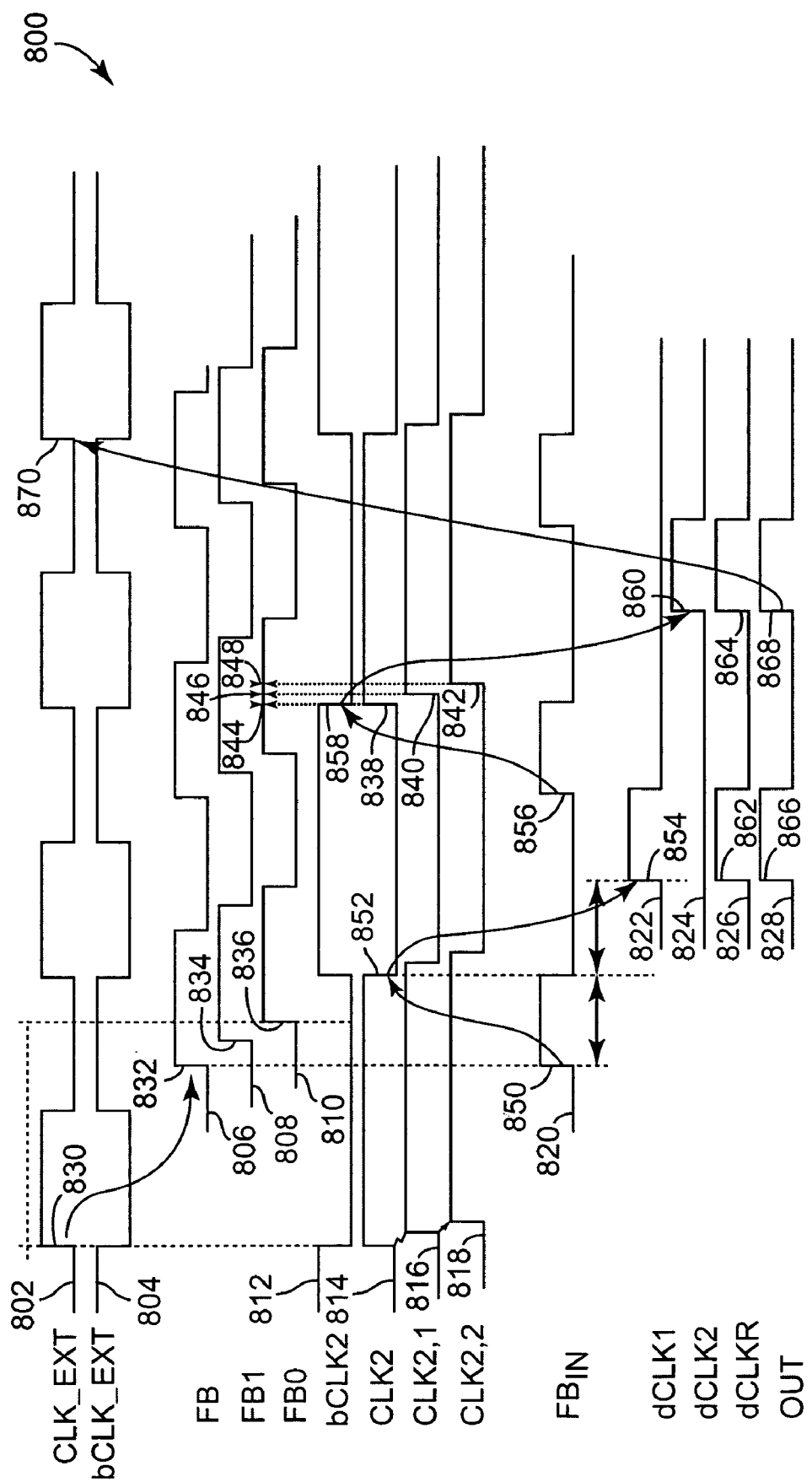
FIG. 11 is a timing diagram illustrating one embodiment of the timing of signals for the portion of the DLL illustrated in FIG. 9.

FIG. 11 is a timing diagram 800 illustrating one embodiment of the timing of signals for DLL1/2 121 illustrated in FIG. 9. Timing diagram 800 includes CLK_EXT signal 802 on CLK_EXT signal path 112, bCLK_EXT signal 804 on bCLK_EXT signal path 114, FB signal 806 on FB signal path 652, FB1 signal 808 on FB1 signal path 656, FB0 signal 810 on FB0 signal path 660. Timing diagram 800 also includes bCLK2 signal 812 on bCLK2 signal path 624, CLK2 signal 814 on CLK2 signal path 622, CLK2,1 signal 816 on CLK2,1 signal path 642, CLK2,2 signal 818 on CLK2,2 signal path 646, FB$_{IN}$ signal 820 on FB$_{IN}$ signal path 686, dCLK1 signal 822 on dCLK1 signal path 630, dCLK2 signal 824 on dCLK2 signal path 632, dCLKR signal 826 on dCLKR signal path 636, and OUT signal 828 on OUT signal path 122.

Rising edge 830 of CLK_EXT signal 802 is delayed by feedback delay zero 650 to provide rising edge 832 of FB signal 806. Rising edge 832 of FB signal 806 is delayed by feedback delay one 654 to provide rising edge 834 of FB1 signal 808. Rising edge 834 of FB1 signal 808 is delayed by feedback delay two 658 to provide rising edge 836 of FB0 signal 810. Clock divider 620 divides the CLK signal by two to provide bCLK2 signal 812 and CLK2 signal 814 both having a frequency one half the frequency of CLK_EXT signal 802. Rising edge 838 of CLK2 signal 814 is delayed by CLK2 delay one 640 to provide rising edge 840 of CLK2,1 signal 816. Rising edge 840 of CLK2,1 signal 816 is delayed by CLK2 delay two 644 to provide rising edge 842 of CLK2,2 signal 818.

Detection circuit 648 determines that the phase of FB0 signal 810 at rising edge 838 of CLK2 signal 814 is logic high, as indicated at 844. Detection circuit 648 also determines that at rising edge 840 of CLK2,1 signal 816, the phase of FB0 signal 810 is also a logic high, as indicated at 846. Detection circuit 648 also determines that at rising edge 842 of CLK2,2 signal 818, the phase of FB0 signal 810 is also a logic high, as indicated at 848. Using table 730 illustrated in FIG. 10B, the logic high signal FB0 810 at 844, 846, and 848 specifies that FB signal 806 is passed to SMD 626 and SMD 628. Therefore, $FB_{IN}$ signal 820 mimics FB signal 806 such that the rising edge 832 of FB signal 806 is mimicked by rising edge 850 of $FB_{IN}$ signal 820. Rising edge 850 of $FB_{IN}$ signal 820 is mirrored by SMD 626 with respect to falling edge 852 of CLK2 signal 814 to provide rising edge 854 of dCLK1 signal 822. Rising edge 856 of $FB_{IN}$ signal 820 is mirrored with respect to falling edge 858 of bCLK2 signal 812 by SMD 628 to provide rising edge 860 of dCLK2 signal 824. Merge circuit 634 provides rising edge 862 on dCLKR signal 826 in response to rising edge 854 of dCLK1 signal 822. Merge circuit 634 provides rising edge 864 of dCLKR signal 826 in response to rising edge 860 of dCLK2 signal 824. Switch 695 passes the dCLKR signal 826 to output signal 828, such that rising edge 862 of dCLKR signal 826 provides rising edge 866 of OUT signal 828 and rising edge 864 of dCLKR signal 826 provides rising edge 868 of OUT signal 828.

If signal FB1 808 or FB0 810 had been selected in place of FB signal 806, switch 695 would have been opened, and switch 696 or 697, respectively, would have been closed to provide OUT signal 828. Rising edge 868 precedes rising edge 870 of CLK_EXT signal 802 such that OUT signal 828 aligns data output from memory circuit 102 with CLK_EXT signal 802.

In one embodiment, DLL 110 provides an efficient DDL by receiving a clock signal, dividing the clock signal by two to provide a divided clock signal, and mirroring with respect to the divided clock signal the fractional portion of the feedback delay remaining after dividing the feedback delay by a multiple of a cycle of the clock signal. DLL 110 uses SMDs to mirror the fractional portion of the feedback delay. In one embodiment, DLL 110 generates a plurality of feedback signals and a plurality of clock signals. The DLL selects one of the plurality of feedback signals to mirror based on a feedback signal's position relative to the rising edges of the plurality of clock signals. The feedback signal having a rising edge farthest away from the rising edge and falling edge of the clock signal is selected to avoid mirroring limitations of the SMD.

What is claimed is:

1. A delay locked loop comprising:
 a circuit configured to:
   receive a clock signal;
   divide the clock signal by two to provide a divided clock signal; and
   mirror with respect to the divided clock signal a fractional portion of a feedback delay remaining after dividing the feedback delay by a multiple of a cycle of the clock signal to provide a first signal.

2. The delay locked loop of claim 1, wherein the circuit is configured to:
 receive an inverted clock signal;
 divide the inverted clock signal by two to provide a divided inverted clock signal; and
 mirror with respect to the divided inverted clock signal the fractional portion of the feedback delay to provide a second signal.

3. The delay locked loop of claim 2, wherein the circuit is configured to:
 divide the clock signal by two to provide an inverted divided clock signal; and
 mirror with respect to the inverted divided clock signal the fractional portion of the feedback delay to provide a third signal.

4. The delay locked loop of claim 3, wherein the circuit is configured to:
 provide a delayed clock signal in response to the first signal and the third signal.

5. The delay locked loop of claim 4, wherein the circuit is configured to:
 divide the inverted clock signal by two to provide an inverted divided inverted clock signal; and
 mirror with respect to the inverted divided inverted clock signal the fractional portion of the feedback delay to provide a fourth signal.

6. The delay locked loop of claim 5, wherein the circuit is configured to:
 provide a delayed inverted clock signal in response to the second signal and the fourth signal.

7. The delay locked loop of claim 6, wherein the circuit is configured to:
 provide a first output signal having a rising edge in response to the delayed clock signal and a falling edge in response to the delayed inverted clock signal.

8. The delay locked loop of claim 7, wherein the circuit is configured to:
 provide a second output signal comprising an inverted first output signal.

9. A delay: locked loop comprising
 a circuit configured to:
   receive a clock signal;
   divide the clock signal by two to provide a divided clock signal and an inverted divided clock signal;
   mirror with respect to a falling edge of the divided clock signal a fractional portion of a feedback delay remaining after dividing the feedback delay by a multiple of a cycle of the clock signal to provide a first signal;
   mirror with respect to a falling edge of the inverted divided clock signal the fractional portion of the feedback delay to provide a second signal; and
   provide a delayed clock signal in response to the first signal and the second signal.

10. The delay locked loop of claim 9, wherein the circuit is configured to:
receive an inverted clock signal;
divide the inverted clock signal by two to provide a divided inverted clock signal and an inverted divided inverted clock signal;
mirror with respect to a falling edge of the divided inverted clock signal the fractional portion of a feedback delay to provide a third signal;
mirror with respect to a falling edge of the inverted divided inverted clock signal the fractional portion of the feedback delay to provide a fourth signal; and
provide a delayed inverted clock signal in response to the third signal and the fourth signal.

11. The delay locked loop of claim 10, wherein the circuit is configured to:
provide a first output signal having a rising edge in response to a rising edge of the delayed clock signal and a falling edge in response the rising edge of the delayed inverted clock signal.

12. The delay locked loop of claim 11, wherein the circuit is configured to:
provide a second output signal comprising an inverted first output signal.

13. A delay locked loop comprising:
a first clock divider configured to receive a clock signal and divide the clock signal by two to provide a divided clock signal and an inverted divided clock signal;
a first feedback delay configured to delay the clock signal to provide a first feedback signal;
a first synchronous mirror delay configured to mirror the first feedback signal with respect to a falling edge of the divided clock signal in response to a rising edge of the first feedback signal during a logic high phase of the divided clock signal to provide a first signal;
a second synchronous mirror delay configured to mirror the first feedback signal with respect to a falling edge of the inverted divided clock signal in response to a rising edge of the first feedback signal during a logic high phase of the inverted divided clock signal to provide a second signal; and
a first merge circuit configured to provide a delayed clock signal in response to the first signal and the second signal.

14. The delay locked loop of claim 13, further comprising:
a first control circuit configured to determine if there will be a rising edge of the first feedback signal during a logic high phase of the divided clock signal and determine if there will be a rising edge of the first feedback signal during a logic high phase of the inverted divided clock signal;
a first switch configured to close in response to the first control circuit determining there will be a rising edge of the first feedback signal during a logic high phase of the divided clock signal to provide the first feedback signal to the first synchronous mirror delay; and
a second switch configured to close in response to the first control circuit determining there will be a rising edge of the first feedback signal during a logic high phase of the inverted divided clock signal to provide the first feedback signal to the second synchronous mirror delay.

15. The delay locked loop of claim 14, further comprising:
a second clock divider configured to receive an inverted clock signal and divide the inverted clock signal by two to provide a divided inverted clock signal and an inverted divided inverted clock signal;
a second feedback delay configured to delay the inverted clock signal to provide a second feedback signal;
a third synchronous mirror delay configured to mirror the second feedback signal with respect to a falling edge of the divided inverted clock signal in response to a rising edge of the second feedback signal during a logic high phase of the divided inverted clock signal to provide a third signal;
a fourth synchronous mirror delay configured to mirror the second feedback signal with respect to a falling edge of the inverted divided inverted clock signal in response to a rising edge of the second feedback signal during a logic high phase of the inverted divided inverted clock signal to provide a fourth signal; and
a second merge circuit configured to provide a delayed inverted clock signal in response to the third signal and the fourth signal.

16. The delay locked loop of claim 15, further comprising:
a second control circuit configured to determine if there will be a rising edge of the second feedback signal during a logic high phase of the divided inverted clock signal and determine if there will be a rising edge of the second feedback signal during a logic high phase of the inverted divided inverted clock signal;
a third switch configured to close in response to the second control circuit determining there will be a rising edge of the second feedback signal during a logic high phase of the divided inverted clock signal to provide the second feedback signal to the third synchronous mirror delay; and
a fourth switch configured to close in response to the second control circuit determining there will be a rising edge of the second feedback signal during a logic high phase of the inverted divided inverted clock signal to provide the second feedback signal to the fourth synchronous minor delay.

17. The delay locked loop of claim 16, further comprising:
a duty restoration circuit configured to provide a first output signal having a rising edge in response to a rising edge of the delayed clock signal and a falling edge in response to a rising edge of the delayed inverted clock signal.

18. The delay locked loop of claim 17, wherein the duty restoration circuit is configured to provide a second output signal having a falling edge in response to the rising edge of the delayed clock signal and a rising edge in response to the rising edge of the delayed inverted clock signal.

19. A method for delaying a clock signal in a delay locked loop, the method comprising:
receiving a clock signal;
dividing the clock signal by two to provide a divided clock signal; and
mirroring with respect to the divided clock signal a fractional portion of a feedback delay remaining after dividing the feedback delay by a multiple of a cycle of the clock signal to provide a first signal.

20. The method of claim 19, further comprising:
receiving an inverted clock signal;
dividing the inverted clock signal by two to provide a divided inverted clock signal; and
mirroring with respect to the divided inverted clock signal the fractional portion of the feedback delay to provide a second signal.

21. The method of claim 20, further comprising:
dividing the clock signal by two to provide an inverted divided clock signal; and mirroring with respect to the inverted divided clock signal the fractional portion of the feedback delay to provide a third signal.

22. The method of claim 21, further comprising:
providing a delayed clock signal in response to the first signal and the third signal.

23. The method of claim 22, further comprising:
dividing the inverted clock signal by two to provide an inverted divided inverted clock signal; and
mirroring with respect to the inverted divided inverted clock signal the fractional portion of the feedback delay to provide a fourth signal.

24. The method of claim 23, further comprising:
providing a delayed inverted clock signal in response to the second signal and the fourth signal.

25. The method of claim 24, further comprising:
providing a first output signal having a rising edge in response to the delayed clock signal and a falling edge in response the delayed inverted clock signal.

26. The method of claim 25, further comprising:
providing a second output signal comprising an inverted first output signal.

27. A memory circuit comprising:
a delay locked loop configured to:
receive a clock signal;
divide the clock signal by two to provide a divided clock signal; and
mirror with respect to the divided clock signal a fractional portion of a feedback delay remaining after dividing the feedback delay by a multiple of a cycle of the clock signal to provide a first signal; and
a memory coupled to the delay locked loop.

28. The memory circuit of claim 27, wherein the memory comprises a synchronous dynamic random access memory.

29. The memory circuit of claim 27, wherein the memory comprises a double data rate synchronous dynamic random access memory.

30. A delay locked loop comprising:
a circuit configured to:
receive a clock signal;
divide the clock signal by two to provide a divided clock signal; and
mirror with respect to the divided clock signal a fractional portion of a feedback delay remaining after dividing the feedback delay by a multiple of a cycle of the clock signal to provide a first signal,
wherein the fractional portion of the feedback delay is mirrored by mirroring a first selected feedback signal from a first set of at least three feedback signals, the first selected feedback signal having a rising edge the farthest away from a rising edge of the divided clock signal.

31. The delay locked loop of claim 30, wherein the circuit is configured to:
receive an inverted clock signal;
divide the inverted clock signal by two to provide a divided inverted clock signal; and
mirror with respect to the divided inverted clock signal the fractional portion of the feedback delay to provide a second signal,
wherein the fractional portion of the feedback delay is mirrored by mirroring a second selected feedback signal from a second set of at least three feedback signals, the second selected feedback signal having a rising edge the farthest away from a rising edge of the divided inverted clock signal.

32. The delay locked loop of claim 31, wherein the circuit is configured to:
divide the clock signal by two to provide an inverted divided clock signal; and
mirror with respect to the inverted divided clock signal the fractional portion of the feedback delay to provide a third signal.

33. The delay locked loop of claim 32, wherein the circuit is configured to:
divide the inverted clock signal by two to provide an inverted divided inverted clock signal; and
mirror with respect to the inverted divided inverted clock signal the fractional portion of the feedback delay to provide a fourth signal.

34. The delay locked loop of claim 33, wherein the circuit is configured to:
merge the first signal and third signal into a fifth signal;
merge the second signal and the fourth signal into a sixth signal;
delay the fifth signal based on the first selected feedback signal;
delay the sixth signal based on the second selected feedback signal; and
provide a delayed clock signal in response to the delayed fifth signal and the delayed sixth signal.

35. A delay locked loop comprising:
a circuit configured to:
receive a clock signal;
divide the clock signal by two to provide a divided clock signal;
delay the divided clock signal to provide a first delayed divided clock signal and a second delayed divided clock signal;
delay the clock signal to provide a feedback signal;
delay the feedback signal to provide a first delayed feedback signal and a second delayed feedback signal;
select one of the feedback signal, the first delayed feedback signal, and the second delayed feedback signal based on a comparison between a rising edge of the divided clock signal, a rising edge of the first delayed divided clock signal, and a rising edge of the second delayed divided clock signal and a phase of the second delayed feedback signal;
mirror with respect to the divided clock signal the selected one of the feedback signal, the first delayed feedback signal, and the second delayed feedback signal to provide a first signal; and
delay the first signal based on the selected one of the feedback signal, the first delayed feedback signal, and the second delayed feedback signal to provide a second signal.

36. A delay locked loop comprising:
a first clock divider configured to receive a clock signal and divide the clock signal by two to provide a divided clock signal and an inverted divided clock signal;
a first divided clock signal delay circuit configured to delay the divided clock signal to provide a first delayed divided clock signal and a second delayed divided clock signal;
a first feedback delay circuit configured to delay the clock signal to provide a first feedback signal, a second feedback signal, and a third feedback signal;
a first detection circuit configured to select one of the first feedback signal, the second feedback signal, and the third feedback signal based on a phase of the third feedback signal with respect to a rising edge of the divided clock signal, a rising edge of the first delayed divided clock signal, and a rising edge of the second delayed divided clock signal;

a first synchronous mirror delay configured to mirror the selected one of the first feedback signal, the second feedback signal, and the third feedback signal with respect to a falling edge of the divided clock signal in response to rising edge of the selected one of the first feedback signal, the second feedback signal, and the third feedback signal during a logic high phase of the divided clock signal to provide a first signal;

a second synchronous mirror delay configured to mirror the selected one of the first feedback signal, the second feedback signal, and the third feedback signal with respect to a falling edge of the inverted divided clock signal in response to a rising edge of the selected one of the first feedback signal, the second feedback signal, and the third feedback signal during a logic high phase of the inverted divided clock signal to provide a second signal;

a first merge circuit configured to provide a third signal in response to the first signal and the second signal; and an output delay configured to delay the third signal based on the selected one of the first feedback signal, the second feedback signal, and the third feedback signal to provide a delayed clock signal.

37. A method for delaying a clock signal in a delay locked loop, the method comprising:

receiving a clock signal;

dividing the clock signal by two to provide a divided clock signal;

delaying the divided clock signal to provide a first delayed divided clock signal and a second delayed divided clock signal;

delaying the clock signal to provide a feedback signal;

delaying the feedback signal to provide a first delayed feedback signal and a second delayed feedback signal;

selecting one of the feedback signal, the first delayed feedback signal, and the second delayed feedback signal based on a comparison between a rising edge of the divided clock signal, a rising edge of the first delayed divided clock signal, and a rising edge of the second delayed divided clock signal and a phase of the second delayed feedback signal;

mirroring with respect to the divided clock signal the selected one of the feedback signal, the first delayed feedback signal, and the second delayed feedback signal to provide a first signal; and delaying the first signal based on the selected one of the feedback signal, the first delayed feedback signal, and the second delayed feedback signal to provide a second signal.

38. A delay locked loop comprising:

means for receiving a clock signal;

means for dividing the clock signal by two to provide a divided clock signal; and means for mirroring with respect to the divided clock signal a fractional portion of a feedback delay remaining after dividing the feedback delay by a multiple of a cycle of the clock signal to provide a first signal.

* * * * *